United States Patent [19]

Takasuka et al.

[11] Patent Number: 5,150,324

[45] Date of Patent: Sep. 22, 1992

[54] ANALOG ARITHMETIC CIRCUIT THAT CAN PERFORM MULTIPLICATION DIVISION EXPANSION AND COMPRESSION BY USING DELTA SIGMA MODULATOR

[75] Inventors: Kaoru Takasuka, Yokohama; Ken'ichi Takahashi, Sagamihara, both of Japan

[73] Assignee: Asahi Kasei Microsystems Co. Ltd., Japan

[21] Appl. No.: 460,077

[22] PCT Filed: Jun. 9, 1989

[86] PCT No.: PCT/JP89/00588

§ 371 Date: Feb. 6, 1990

§ 102(e) Date: Feb. 6, 1990

[87] PCT Pub. No.: WO89/12280

PCT Pub. Date: Dec. 14, 1989

[30] Foreign Application Priority Data

Jun. 9, 1988 [JP] Japan ................. 63-140492
Aug. 1, 1988 [JP] Japan ................. 63-190683
Aug. 4, 1988 [JP] Japan ................. 63-193384
Aug. 4, 1988 [JP] Japan ................. 63-193385

[51] Int. Cl.[5] .................................... G06G 7/16
[52] U.S. Cl. ........................ 364/807; 364/841; 364/602; 364/606
[58] Field of Search ............ 364/807, 736, 751, 841, 364/602, 606; 340/347 AD; 341/143

[56] References Cited

U.S. PATENT DOCUMENTS

| 4,422,155 | 12/1983 | Amir et al. ............... 364/606 |
| 4,439,756 | 3/1984 | Shenoi et al. ............ 340/347 AD |
| 4,509,037 | 4/1985 | Harris ..................... 340/347 AD |
| 4,588,981 | 5/1986 | Senn ....................... 340/347 AD |
| 4,866,442 | 9/1989 | Steim et al. ............ 341/143 |
| 4,939,516 | 7/1990 | Early ...................... 341/143 |

FOREIGN PATENT DOCUMENTS 55-82375 6/1980 Japan.

OTHER PUBLICATIONS

Yoneda et al., "Switched-Capacitor Non-Recursive Lowpass Filter," Int. J. Electronics, 1986, vol. 60, No. 3, pp. 395–401.

Blesser et al., "A New Approach to Dynamic Range Compression for Audio Systems", Audio Engineering Society, 35th Convention, Preprint No. 602 (K-10), Oct. 1968.

Bradinal et al., "A High-Performance CMOS stereo ADS and DAC Chip-Set for Digital Audio," IEEE International Conference on Consumer Electronics, Jun. 1987, pp. 48–49.

Primary Examiner—Jerry Smith
Assistant Examiner—Jim Trammell

[57] ABSTRACT

An analog arithmetic circuit for executing multiplications, divisions, compressions, expansions and combinations thereof. The arithmetic circuit is provided with a $\Delta\Sigma$ modulator comprising an A/D converter and a first D/A converter, a second D/A converter for receiving the output from the $\Delta\Sigma$ modulator, and a low-pass filter which receives the output of the second D/A converter and outputs the result of an arithmetic operation. The arithmetic circuit can be fabricated in the form of a MOS LSI because it does not use a precise triangle waveform generator for pulse width modulation.

11 Claims, 12 Drawing Sheets

ANALOG ARITHMETIC CIRCUIT THAT CAN PERFORM MULTIPLICATION DIVISION EXPANSION AND COMPRESSION BY USING DELTA SIGMA MODULATOR

TECHNICAL FIELD

The present invention relates to an analog arithmetic circuit, and more particularly to an analog arithmetic circuit adapted to execute arithmetic operations such as multiplications, additions, divisions, compressions and expansions, as well as combinations thereof.

BACKGROUND ART

In some conventional analog multipliers, a multiplication is executed, for instance, by adding logarithmic functions represented by the equation $I \approx Is \cdot e^{KV}$ that expresses the relationship between the current I and the voltage V at a PN junction (where I = the current flowing through the PN junction; Is = a saturation current; V = a voltage across the PN junction; and K = a constant).

However, the voltage V across the PN junction in the conduction state is on the order of about 0.6 V, and hence, the magnitude of an analog input signal is limited. As a result, it has been impossible to execute a multiplication of analog signals each having a large amplitude. Furthermore, in this type of multiplication, the arithmetic operations are frequently adversely affected by noises so that it cannot be expected to obtain a product with a high degree of accuracy. In addition, it has been difficult to construct this type of analog circuit in the form of an MOS-LSI.

There has been proposed and demonstrated a time-division type multiplier (for instance, as disclosed in the Japanese Patent Application Laying Open No. 55-82375), in which a first input voltage Ex and its inverted voltage −Ex are alternately switched on, and the duty ratio of the switching is subjected to the pulse-width modulation by a second input voltage Ey. After that, the pulse-width modulated outputs are averaged, thereby obtaining the output Ex×Ey.

In this circuit, however, the pulse-width modulated output is obtained as a level ratio between an analog input signal Ey and a triangle waveform signal. Consequently, the pulse duration of the output takes an arbitrary value as long as the analog input signal takes an arbitrary value, even if the frequency of the triangle waveform signal is maintained constant. In other words, the pulse duration takes a continuous value. In view of the fact that the duty ratio of the pulse-width modulation circuit varies continuously, a high-speed and high-accuracy analog circuit is required in order to make the duty ratio correctly follow the original signal.

In addition, a triangle generator in a pulse-width modulation circuit must have a high degree of accuracy because the amplitude and frequency of the triangle waveform signal considerably affect the modulation characteristics. This not only makes it difficult to fabricate the generator in the form of an MOS-LSI, but also makes the generator susceptible to noises.

Two types of conventional analog dividers are well known in the art: one is a system utilizing a logarithmic amplifier; and the other is a multiplication-feedback system in which analog multiplier is inserted into the feedback loop of an operational amplifier. However, the former system has the problems that the arithmetic operation speed is slow, and that only the arithmetic operation can be achieved between an operated signal (a signal that represents the entity such as dividend) and an operating signal (a signal that represents the entity such as divisor) of either positive or negative signs. In the case of the latter, since the system has the feedback loop including the multiplier, it tends to oscillate so that a satisfactory degree of stability cannot be achieved.

Two types of conventional analog expansion and compression circuits are well known in the art: a system using a gain control circuit utilizing a nonlinear characteristic of bipolar transistors; and a system using a diode-clamp piecewise linear approximation circuit including a resistor-diode network. In these systems, when they are used as an expansion circuit, the nonlinear element is connected to the input of an amplifier, whereas when they are used as a compression circuit, the nonlinear element is inserted into the feedback loop.

As a result, the system using the nonlinear characteristic of the bipolar transistors presents the problems that each transistor has a different nonlinear characteristic, and that it is difficult to make the system compact in the form of an LSI. On the other hand, the system using the diode-clamp piecewise linear approximation circuit must use a large number of resistors, and hence, it is substantially difficult to construct the system in the form of an LSI.

The above-described various conventional analog arithmetic circuits have their own defects. In addition, their circuit configurations are greatly different from one another according to the arithmetic operations demanded, so that they cannot be used in common and cannot be universalized. As a result, even if it is possible to construct them in the form of an LSI, various types of LSIs must be fabricated. This will greatly reduce the merits resulting from the mass production system.

DISCLOSURE OF THE INVENTION

One of the objects of the present invention is to provide an analog arithmetic circuit which can substantially solve the above and other problems encountered in the conventional analog arithmetic circuits.

Another object of the present invention is to provide an analog arithmetic circuit which has a simple construction and a stable operation.

A further object of the present invention is to provide an analog arithmetic circuit which can be fabricated in the form of an MOS-LSI so that the analog arithmetic circuit can be made compact in size.

A still further object of the present invention is to provide a universal type analog arithmetic circuit which can use a fundamental common circuit for executing various arithmetic operations.

To accomplish the above objects, an analog arithmetic circuit according to the present invention is provided with the following elements:

a $\Delta\Sigma$ modulation means having an A/D conversion means which samples an operated signal by a predetermined sampling frequency thereby outputting a digital signal, and having a first D/A conversion means which receives the digital signal, outputs a first analog signal that takes a positive or negative amplitude in response to a first reference signal, and feeds the first analog signal back to the A/D conversion means as a difference input;

a second conversion mean for receiving the digital signal and outputting a second analog signal swinging to positive and negative in response to a second reference signal; and a low-pass filtering means for receiving the second analog signal and outputting an analog signal representing the result of an arithmetic operation, wherein at least one of the first reference signal or the second reference signal is selected as the operating signal.

The digital signal outputted from $\Delta\Sigma$ modulation means can be a 1-bit digital signal.

Furthermore, each of the first and second conversion means can be constructed with an operational amplifier and switched-capacitors.

The low pass filtering means can also be constructed with an operational amplifier and switched-capacitors.

More preferably, the second reference signal is inputted as an operation signal so that the output signal representative of the product of the operated signal and the operating signal can be produced.

When the first reference signal is inputted as an operating signal, the signal representative of the quotient obtained by dividing the operated signal by the operating signal can be produced.

When the signal obtained by rectifying-and-averaging operation of the operated signal is as the second reference signal, i.e., as an operating signal, it becomes possible to output an expanded signal.

Furthermore, when the signal obtained by rectifying-and-averaging the quotient signal is used as the first reference signal, i.e., as the operating single, it becomes possible to output a compressed signal.

It is preferable that the rectifying-and-averaging operation be carried out by using switched-capacitors, a comparator, and an operational amplifier.

More preferably, the analog arithmetic circuit can be provided with a selection means for selecting a predetermined output as the operating signal instead of the rectified-and-averaged output when the rectified-and-averaged output is decreased below a predetermined value.

BEST MODE FOR CARRYING OUT THE INVENTION

Figure 1:
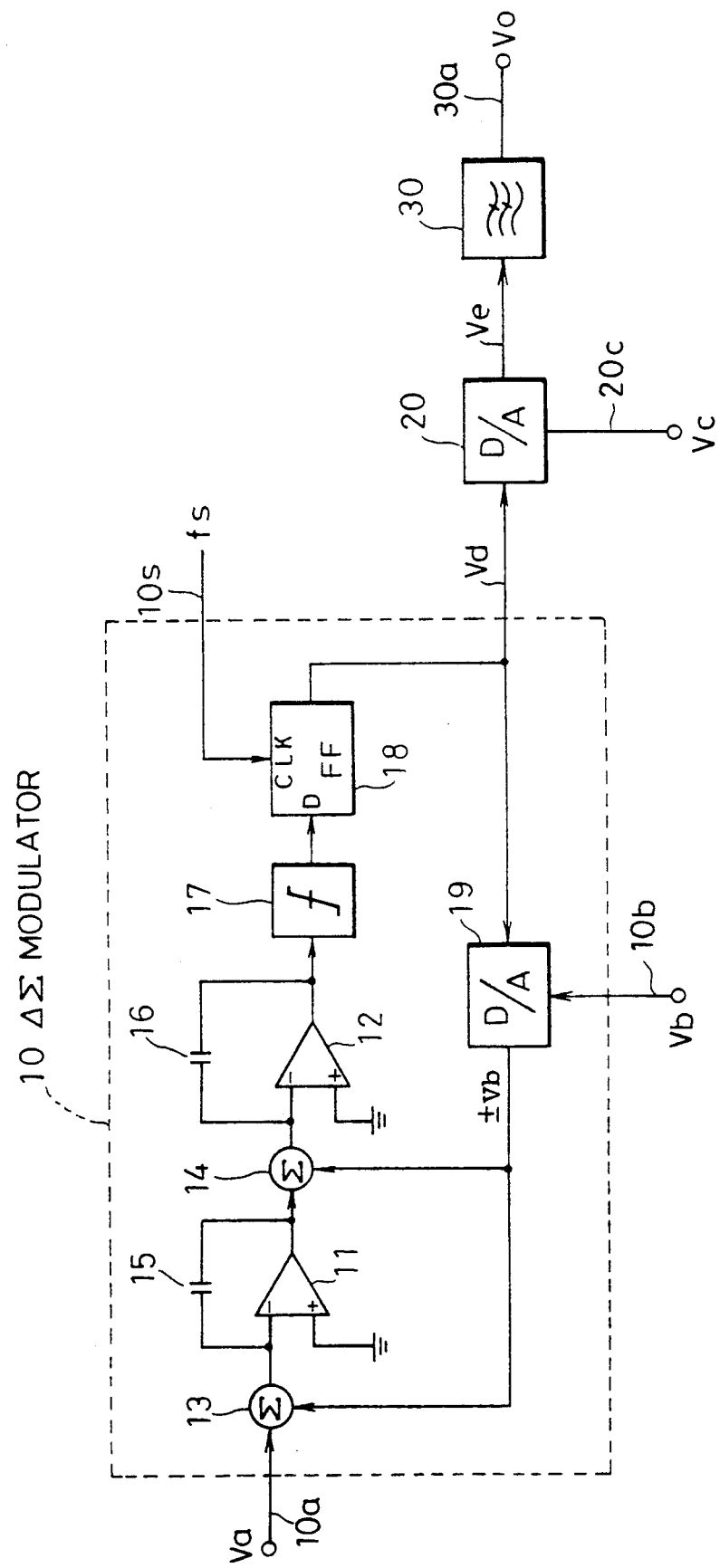
FIG. 1 is a block diagram showing a basic construction of an analog arithmetic circuit in accordance with the present invention.

FIG. 1 is a block diagram illustrating the basic construction of an analog arithmetic circuit in accordance with the present invention. The analog arithmetic circuit comprises $\Delta\Sigma$ modulator 10, a second D/A converter 20 and a low-pass filter 30. The basic construction of the $\Delta\Sigma$ modulator 10 is well known, and in general, converts an analog signal into a pulse-density modulated signal. Various types of the $\Delta\Sigma$ modulator are well known in the art.

In the analog arithmetic circuit shown in FIG. 1, a dual-modulation-type $\Delta\Sigma$ modulator 10 is used, which comprises operational amplifiers 11 and 12, adders 13 and 14, and feedback capacitors 15 and 16 connected to the operational amplifiers 11 and 12, respectively. Because of the capacitors 15 and 16, each operational amplifier 11 or 12 functions as an integrator. The $\Delta\Sigma$ modulator further comprises a comparator 17, a flip-flop 18 for receiving the output of the comparator 17 in synchronism with clock pulses having a sampling frequency (fs), a first D/A converter 19 (1-bit D/A converter), an input line a for inputting an operated signal (an analog signal), a line 10b for supplying a reference signal Vb to the first D/A converter 19, a line 10s for delivering clock pulses fs to the flip-flop 18, a line c for delivering a reference electrical signal Vc to the second D/A converter 20, and an output line 30a of the analog arithmetic circuit.

The frequency of the clock pulses delivered through the line 10s must be at least ten times higher than the maximum frequency of the operated signal, and preferably should be as high as 50-1000 times. The frequency less than 10 times is not preferable because S/N ratio declines accordingly.

Quantizing noise in the $\Delta\Sigma$ modulator 10 increases at the high frequency band. In order to improve the frequency characteristics with regard to the quantizing noise, the following techniques can be used: a plurality of integrators, each using an operational amplifier, are connected in a serial fashion as shown, for instance, in FIG. 1; and/or the D/A converter 19 is constructed so as to convert not a single bit but multi-bits.

Figure 2:
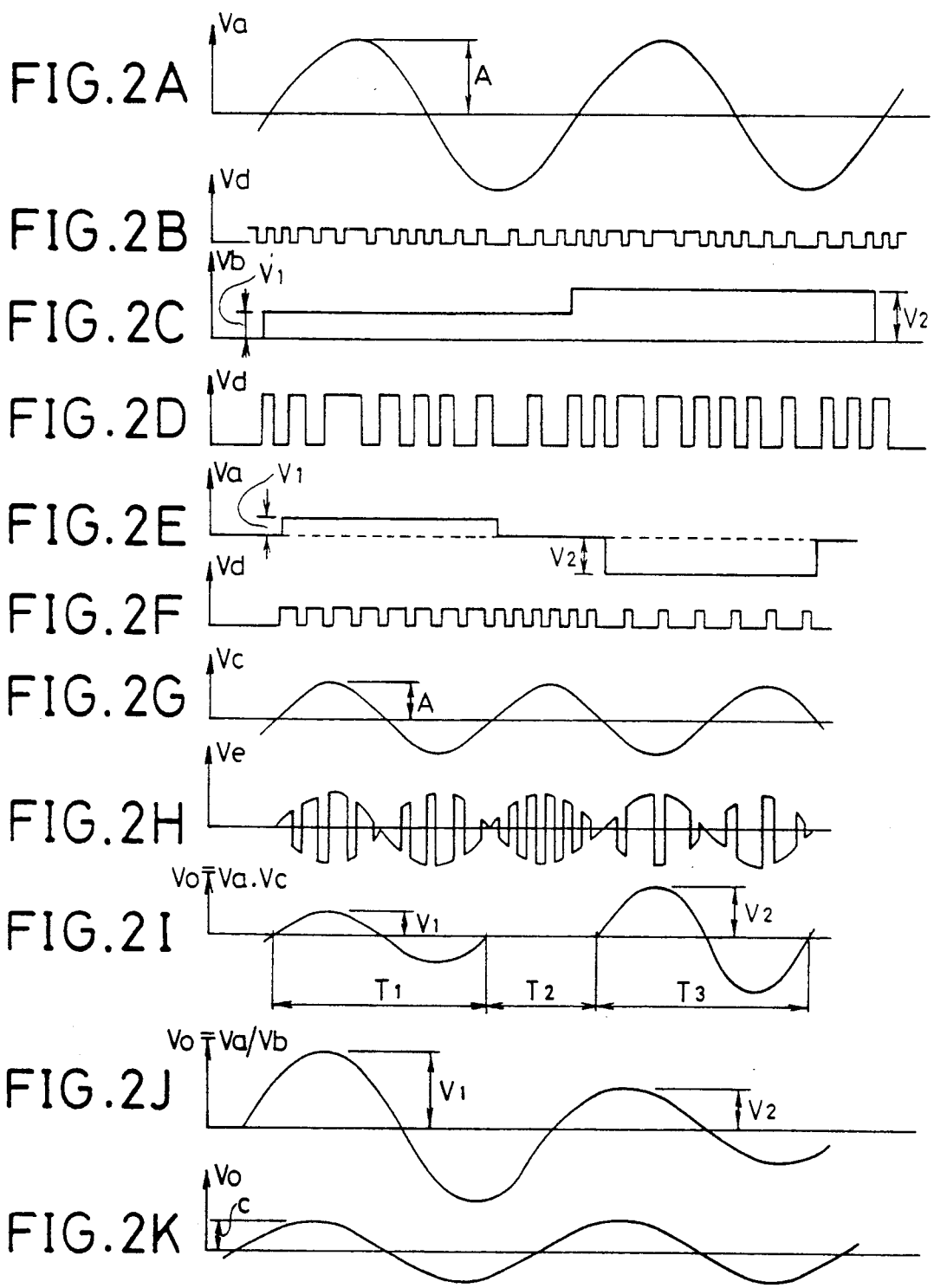
FIGS. 2A-2K are diagrams illustrating waveforms at various points of the analog arithmetic circuit of the present invention.

Referring to FIG. 1, the operated signal (analog signal) having, for example, a sinusoidal waveform with a peak A as shown in FIG. 2A is transmitted through the line 10a.

The operated signal (FIG. 2A) and the output from the first D/A converter 19 are fed to the adder 13 which in turn delivers its output to the inverting input terminal of the operational amplifier 11. The adder 14, receiving the output of the operational amplifier 11 and the output of the D/A converter 19, produces the sum of these signals, and feeds it to the inverting input terminal of the operational amplifier 12. The noninverting input terminals of the operational amplifiers 11 and 12 are connected to an analog ground voltage.

The comparator 17 compares the output of the operational amplifier 12 with the analog ground voltage, and outputs "1" when the output of the operational amplifier 12 is higher than the analog ground voltage. Otherwise, it outputs "0".

The 2-value output of the comparator 17, i.e., a "1" or a "0", is delivered to a data input terminal of the flip-flop 18. The clock pulses, the frequency fs of which is more than several tens of times higher than that of the operated signal Va are supplied through the line 10s. In synchronism with each clock pulse, the data "0" or "1" from the comparator 17 is read into the flip-flop 18.

Thus, the operated signal Va (FIG. 2A) is sampled at a high speed in synchronism with the clock pulse fs, and is converted, for instance, into 1-bit digital output, Vd as shown in FIG. 2B.

The comparator 17 and the flip-flop 18 are not restricted to a 1-bit circuit. It can be multi-bit circuit. However, in the later description, the 1-bit A/D conversion will be explained for easier understanding of the present invention.

The digital signal Vd (FIG. 2B) forms a pulse train having pulse density proportional to the instantaneous value of each sampling of the operated signal (FIG. 2A). The pulse of the digital output Vd takes only discrete duration of 1/fs (second) multiplied by an integer, because the flip-flop 18 operates in response to the clock pulse fs. More particularly, as best shown in FIG. 2B, the pulse density varies in response to the amplitude and polarity of the operated signal Va (FIG. 2A): the density of "1" increases as the input signal increases toward positive; the density of "1" and "0" are equal when the amplitude is zero, i.e., when no signal exists.

The first D/A converter 19 converts the first reference signal into the positive or negative analog signal ±Vb in response to the digital signal supplied from the flip-flop 18, and the analog output thus obtained is fed back as a difference signal ±Vb to the operational amplifiers 11 and 12 through the adders 13 and 14, respectively. As a result, the difference between the current operated signal Va and the analog signal ±Vb corresponding to the digital signal at the previous sampling time is always integrated.

When the reference signal to the first D/A converter 19 is Vb, the respective difference outputs fed from the adders 13 and 14 to the operational amplifiers 11 and 12 take the following values: when the output of the flip-flop 18 is "1", the difference outputs take a value Va−Vb; whereas, when the output of the flip-flop 18 is "0", the difference outputs take a value of Va+Vb. For instance, as shown in FIG. 2C, when the reference signal Vb (=V1 or V2) applied to the first D/A converter 19 through the line 10b, shown in FIG. 1, the output Vd from ΔΣ modulator 10 becomes a 1-bit digital signal as shown in FIG. 2D. When the reference signal Vb=V1, the digital signal (in the left half of FIG. 2D) forms a pulse train with the pulse density proportional to Va in response to the values of the operated signal Va (FIG. 2A) and the reference signal Vb=V1. Likely, the reference signal Vb=V2, the digital signal becomes a pulse train with the pulse density proportional to Va/V2.

So far the reference signal Vb has been described as the positive signal (voltage or current). With regard to the negative reference signal, the pulse train can be obtained in a manner substantially similar to that described above.

When the reference signal Vb of a constant value is supplied to the first D/A converter 19, the output signal Vd of the ΔΣ modulator 10 forms a pulse train having a pulse density proportional to the operated signal.

The output Vd from ΔΣ modulator 10 is delivered to the second D/A converter 20. For the simplicity of the explanation, the operated signal Va inputted to the line 10a is supposed to take values V1, 0, and −V2 as shown in FIG. 2E, and the reference signal fed through the line 10b is supposed to be maintained at a constant value. Then, the ΔΣ modulator 10 will produce a pulse train shown in FIG. 2F.

Next, consider the case when the sinusoidal signal with a peak value A as shown in FIG. 2G is delivered to the second D/A converter 20 through the line 20c as a reference signal Vc. In response to the "1" or "0" of the digital signal Vd shown in FIG. 2F, the second D/A converter 20 produces the signal Ve shown in FIG. 2H, which is obtained by converting the signal Vc in FIG. 2G into the signal alternately swinging in positive and negative directions.

The operation of the second D/A convertr 20 is similar to that of the first D/A converter 19, and hence, when the reference signal Vc thereto is maintained constant, the digital output Vd of the ΔΣ modulator 10 is converted into an analog signal directly corresponding to the digital output Vd by the second D/A converter 20. The output Ve of the second D/A converter 20 is delivered to the low-pass filter 30 so that the higher frequency components above the cutoff frequency is suppressed. As the low-pass filter 30, for instance, a conventional passive filter consisting of capacitors and resistors, or an active filter consisting of capacitors, resistors and an operational amplifier can be used.

Furthermore, the low-pass filter 30 can be constructed with switched-capacitors. In this case, the aliasing noise problem arises, but the analog arithmetic circuit in accordance with the present invention has an advantage that such problem will never arise.

More specifically, the switched-capacitor filter samples the input signal by the sampling clock so that the signal in the frequency band between (the frequency of the sampling clock multiplied by an integer)±(the frequency of the passband of the filter) are folded back to the passband. In the conventional analog multiplier using a conventional pulse-width modulation circuit, the duration of the output pulses is indefinite as described above, and hence, the frequency spectrum of the output pulses will be spread over the entire band, and the frequency spectrum of the entire band can be folded back. Therefore, in order to prevent such folding back (aliasing noise), an antialiasing filter must be placed at the preceding stage of the switched-capacitor filter, thus suppressing the higher frequency components above the cutoff frequency of the filter.

In contrast, according to the embodiment of the present invention, both the sampling clock frequency fs of the ΔΣ modulator 10 and the sampling clock frequency of the switched-capacitors in the low-pass filter 30 are set sufficiently high, i.e., are selected N (an integer more then ten) times higher than the frequencies of the passband. As a result, it is not necessary to place the antialiasing filter at the preceding stage of the switched-capacitor filter.

Furthermore, both the first D/A converter 19 and the second D/A converter 20 can be constructed by using the switched-capacitors.

Figure 3:
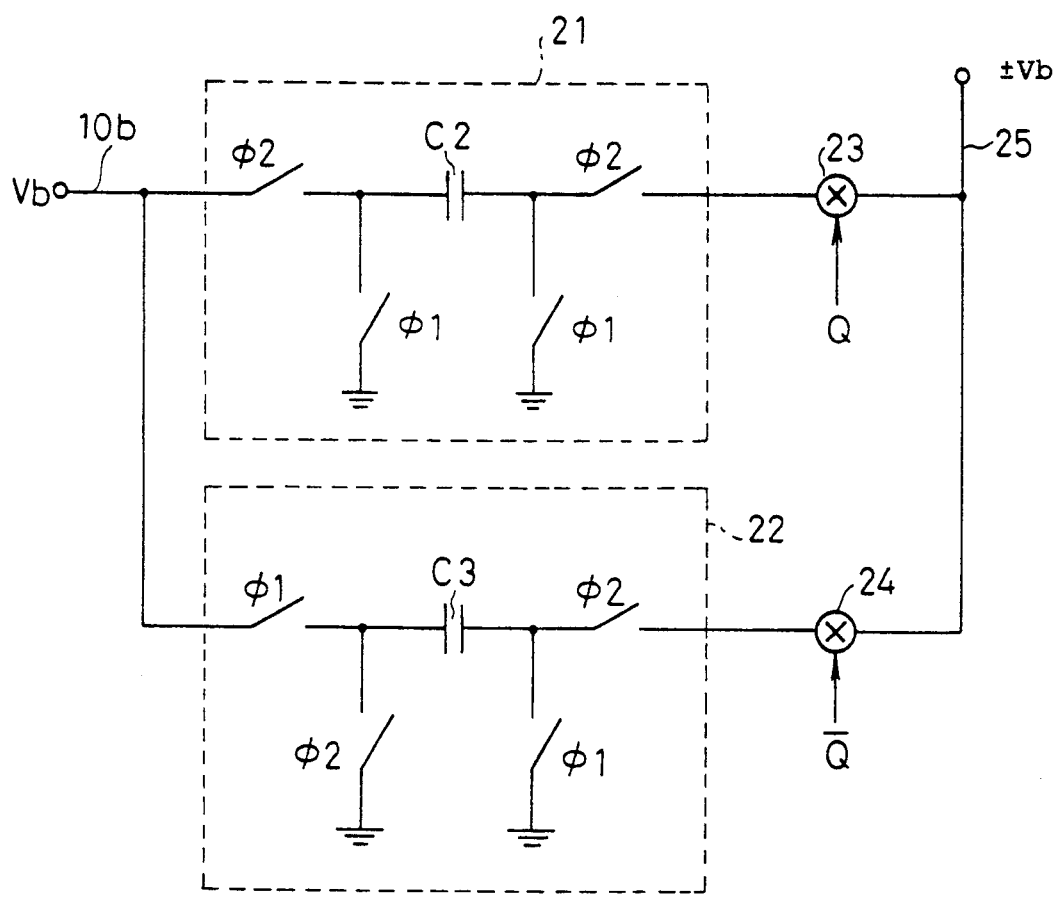
FIG. 3 is a block diagram illustrating a first or a second D/A converter of the analog arithmetic circuit of the present invention.

FIG. 3 illustrates the first D/A converter 19 arranged by using the switched-capacitor system (the second D/A converter 20 can be arranged in a similar manner). The first D/A converter 19 comprises a first switched-capacitor circuit 21, a second switched-capacitor circuit 22, and a first gate 23 and a second gate 24 connected to the outputs of the circuits 21 and 22, respectively. A reference signal Vb is fed through the line 10b, and the analog output ±Vb is produced through an output line 25.

The first switched-capacitor circuit 21 comprises a capacitor C2, a pair of switches $\phi 1$ for discharging the capacitor C2, and another pair of switches $\phi 2$. The first and second switch pairs $\phi 1$ and $\phi 2$ are turned on and off by clocks that do not overlap each other.

The second switched-capacitor circuit 22 comprises a capacitor C3, and a first and a second switch pairs $\phi 1$ and $\phi 2$ for charging and discharging the capacitors C3, which are arranged in a manner different from the switch pairs $\phi 1$ and $\phi 2$ described above.

Next, the operation of the first D/A converter 19 will be described in more detail.

When the switches $\phi 1$ are turned on and the switches $\phi 2$ are turned off, the capacitor C2 is discharged, while the capacitor C3 is charged. In contrast, when the switches $\phi 1$ are turned off and the switches $\phi 2$ are turned on, the capacitor C2 is ready to be charged, while the capacitor C3 is ready to be discharged. Assuming that the flip-flop 18 in FIG. 1 in the $\Delta\Sigma$ modulator 10 outputs a 1-bit digital signal, either the first gate 23 or the second gate 24 is selected in response to the output Q or $\bar{Q}$.

When the output Q is fed, the first gate 23 is turned on so that the reference voltage, Vb charging the capacitor C2, is supplied to the next stage via the output line 25. On the other hand, when the output $\bar{Q}$ is fed, the second gate 24 is turned on, and the stored charge in the capacitor C3 opposite in voltage to the reference signal Vb is outputted through the output line 25.

Thus, the referece signal Vb supplied through the line 10b is converted into a positive or a negative analog signal of a constant magnitude, ±Vb and is outputted through the output line 25 in response to the digital signal Q or $\bar{Q}$.

Figure 4A:
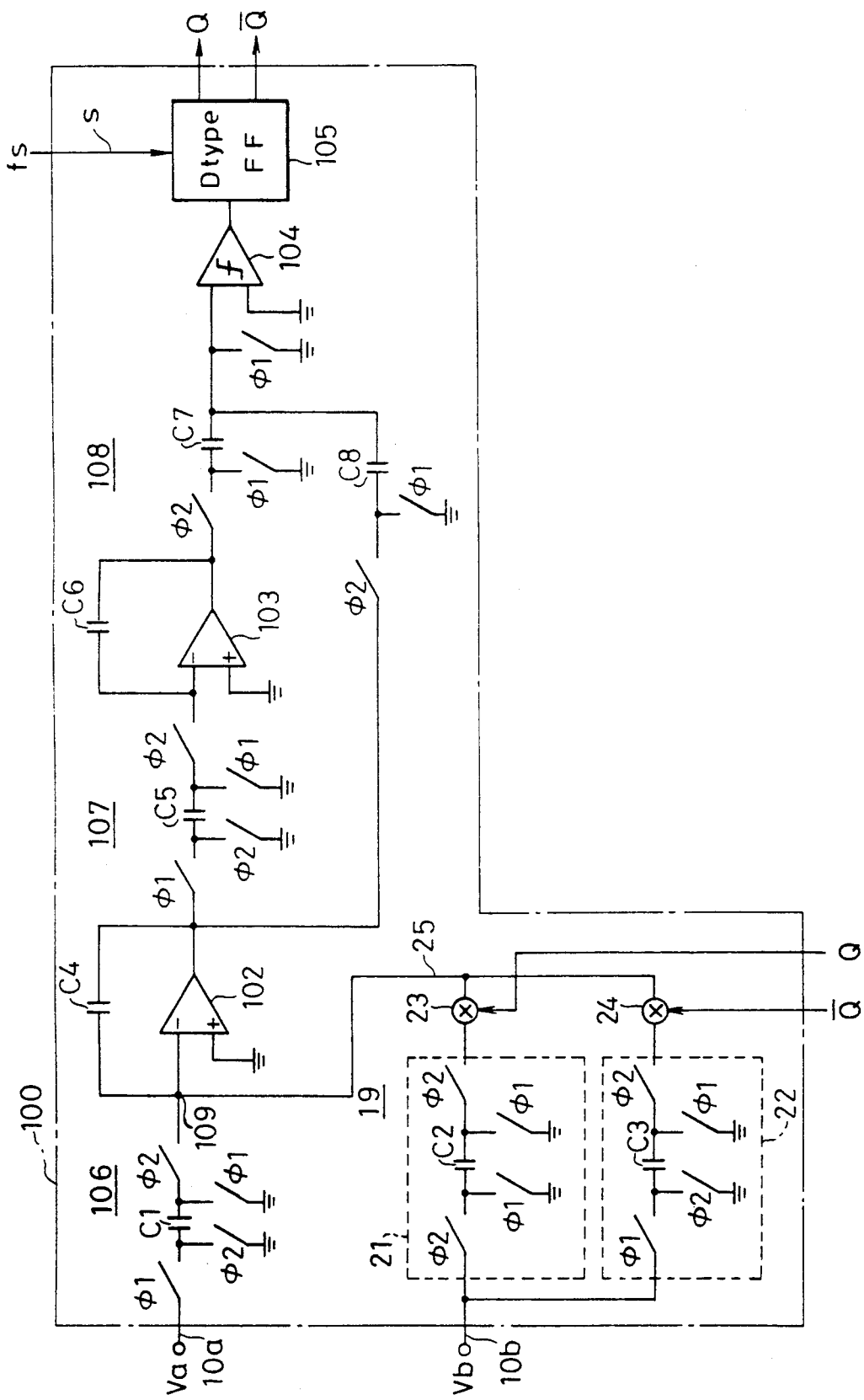
FIG. 4A is a block diagram illustrating $\Delta\Sigma$ modulator of the analog arithmetic circuit of the present invention.

FIG. 4A illustrates the $\Delta\Sigma$ modulator 100 using the D/A converter 19 described above with reference to FIG. 3.

The $\Delta\Sigma$ modulator 100 comprises a first sampling unit 106 for sampling the operated signal, operational amplifiers 102 and 103, feedback capacitors C4 and C6 connected to the operational amplifiers 102 and 103, respectively, a comparator 104, a D flip-flop 105, a first D/A converter 19, a second sampling unit 107, and an adder 108. The operation of the switches $\phi 1$ and $\phi 2$, and the output signals Q and $\bar{Q}$ are substantially similar to those described above with reference to FIG. 3.

The operated signal Va supplied through the line 10a charges the capacitor C1 so as to be sampled while the switches $\phi 1$ in the first sampling unit 106 are turned on. In contrast, when the switches $\phi 2$ are turned on, the charged (sampled) signal is supplied through an adding point 109 to the operational amplifier 102 in which the operated signal Va is integrated. The output of the operational amplifier 102 charges the capacitor C5 so as to be sampled in the second sampling unit 107 when the switches $\phi 1$ are turned on. Then, the charged (sampled) signal is supplied to the operational amplifier 103 so as to be integrated when the switches $\phi 2$ are turned on.

When the switches $\phi 2$ is turned on, the capacitor C7 is charged by the output from the operational amplifier 103, and the capacitor C8 is charged by the output from the operational amplifier 102. Both the outputs of these capacitors are added by the adder 108, and are delivered to the comparator 104 so as to be compared with the ground voltage. In response to the result of comparison, the comparator 104 delivers the output "1" or "0" to the flip-flop 105.

This output, which is latched into the flip-flop 105 by the leading edge of the clock pulse having the sampling frequency fs, is produced as a 1-bit digital signal Q and $\bar{Q}$.

Figure 4B:
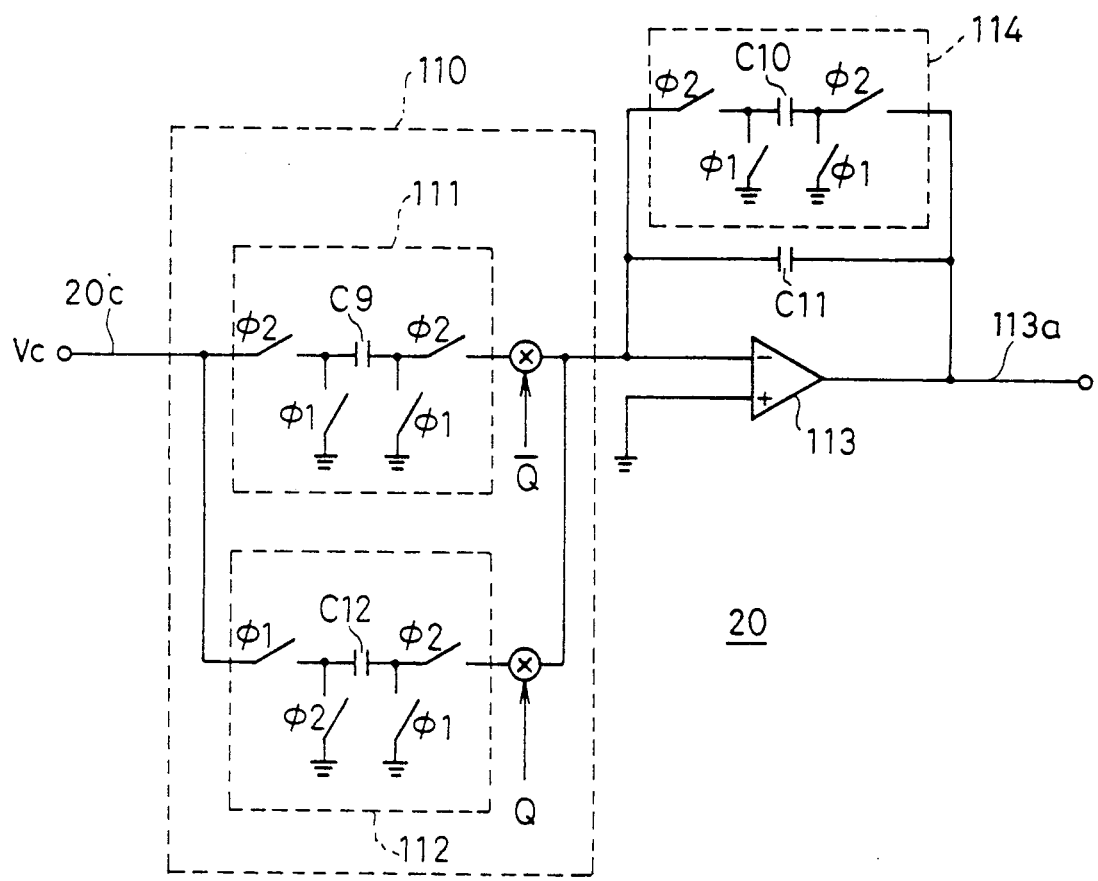
FIG. 4B is a block diagram illustrating a circuit consisting of the second D/A converter and a low-pass filter of the analog arithmetic circuit of the present invention.

FIG. 4B illustrates a circuit constructed into one body by integrating the second D/A converter 20 and the low-pass filter 30 in FIG. 1 using switched capacitors. A second D/A converter 110 including switched-capacitors 111 and 112 is substantially similar in construction to the first D/A converter 19 described above with reference to FIG. 3. The output from the second D/A converter 110 is delivered to the inverting input terminal of an operational amplifier 113. To the noninverting input terminal thereof, on the other hand, the analog ground voltage is applied. A capacitor $C_{11}$ and a switched-capacitor 114 are interconnected between the inverting input terminal and the output line 113a of the operational amplifier 113.

In response to the output Q or $\bar{Q}$ from the $\Delta\Sigma$ modulator 10, the second D/A converter 110 supplies the reference signal Vc entering the line 20c to the noninverting input terminal of the operational amplifier 113, either in a noninverting form +Vc or in an inverting form Vc. Owing to the charging and discharging of the capacitor $C_{10}$ in response to the ON/OFF of the switches $\phi 1$ and $\phi 2$, the switched-capacitor 114 functions as a kind of feedback resistor, and operates as a low-pass filter in conjunction with the switched-capacitor 111 or 112. In short, the reference signal Vc is not reversed or reversed in response to the outputs Q and $\bar{Q}$ of the $\Delta\Sigma$ modulator 10, and the high frequency component of the reference signal Vc is cut off by the low-pass filter, and then the output signal of the filter is produced from the output line 113a.

The analog arithmetic circuit in accordance with the present invention can execute various arithmetic operations such as multiplication, division, expansion, compression and the combinations thereof by supplying on operated or operating signal (analog signal) as a reference signal to at least one of the first and second D/A converters 19 and 20 as will be described hereinafter.

Figure 5:
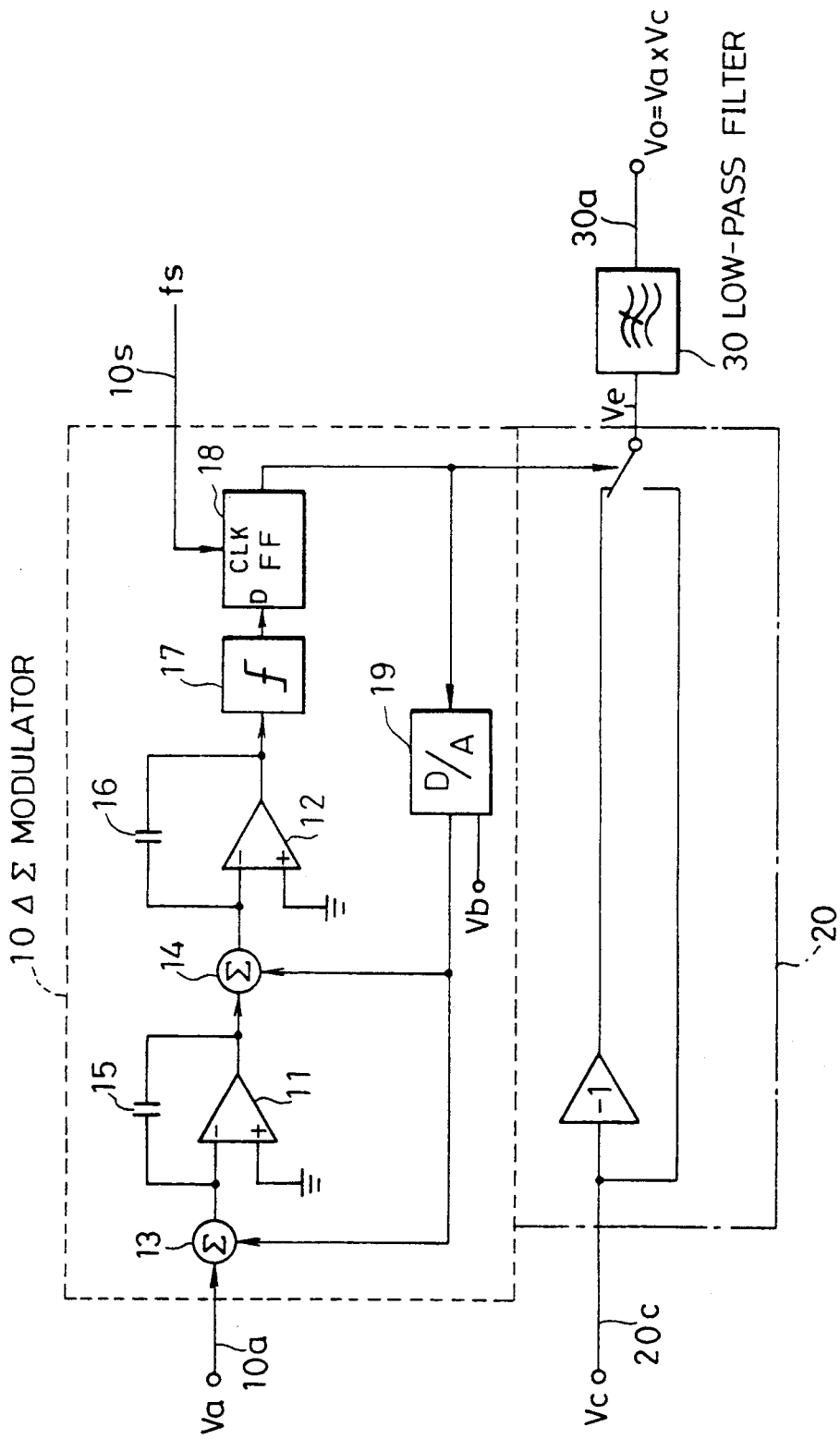
FIG. 5 is a block diagram of the analog arithmetic circuit in accordance with the present invention when it is used as a multiplier.

1) Multiplication (FIG. 5)

An operated signal Va is fed to the line 10a, an operating signal Vc is fed to the line 20c, and a constant reference signal Vb is applied to the line 10b so that the product Vo = Va × Vc can be obtained from the line 30a.

2) Division (FIG. 5)

An operated signal Va is fed to the line 10a, an operating signal Vb is applied to the line 10b, and a constant reference voltage Vc is fed to the line 20c. Then the output Vo = Va/Vb is derived from the output line 30a.

Figure 7:
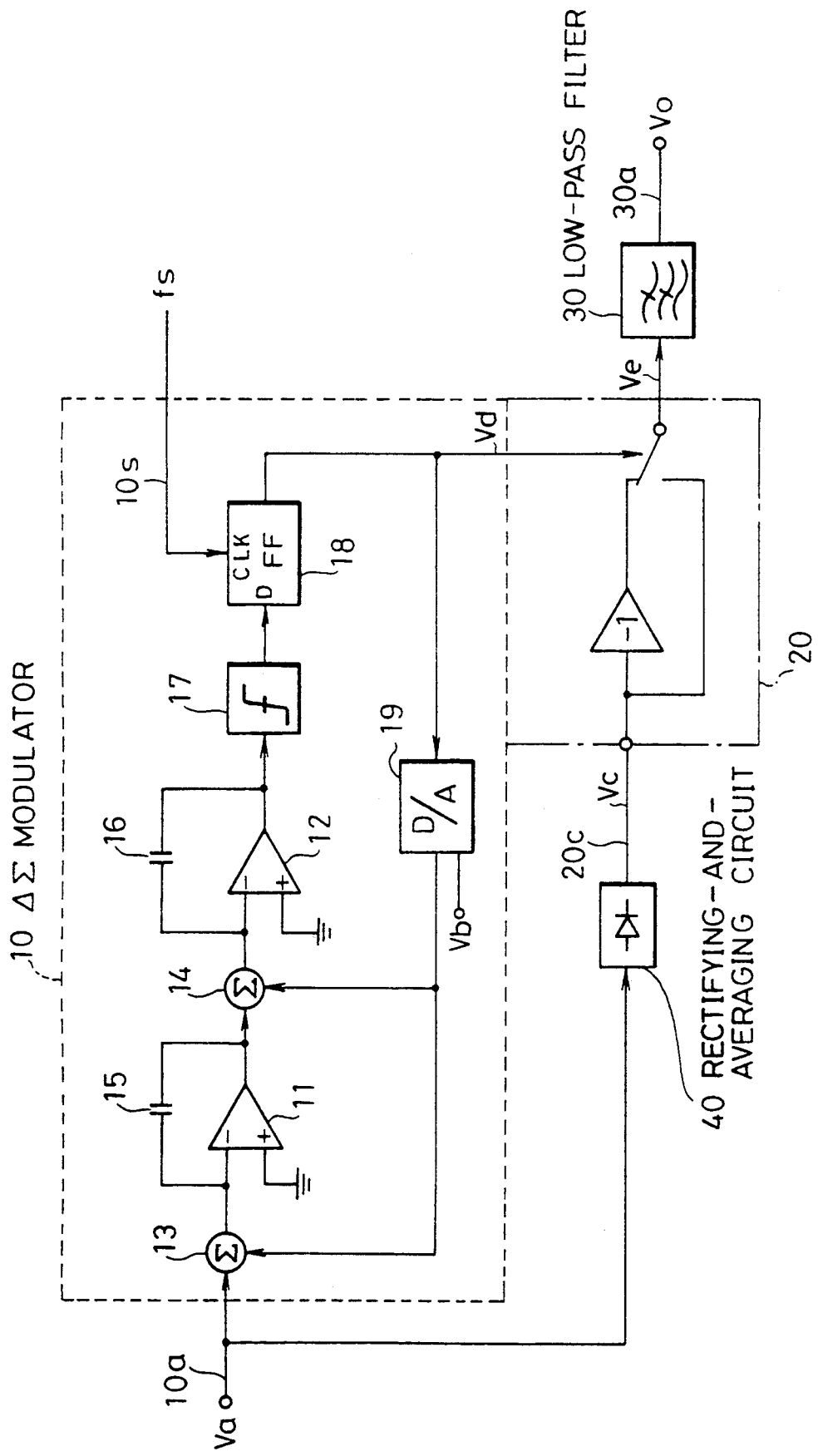
FIG. 7 is a block diagram of the analog arithmetic circuit in accordance with the present invention when it is used as an expansion circuit.

3) Expansion (FIG. 7)

An operated signal Va is fed to the line 10a; the signal obtained by processing the operated signal Va by the rectifying-and-averaging circuit 40 (to be described in detail hereinafter) is applied to the line 20c as an operating signal Vc; and a predetermined constant reference voltage Vb is applied to the line 10b. Then the expanded signal Vo of the operated signal Va A is obtained from the output line 30a.

Figure 8:
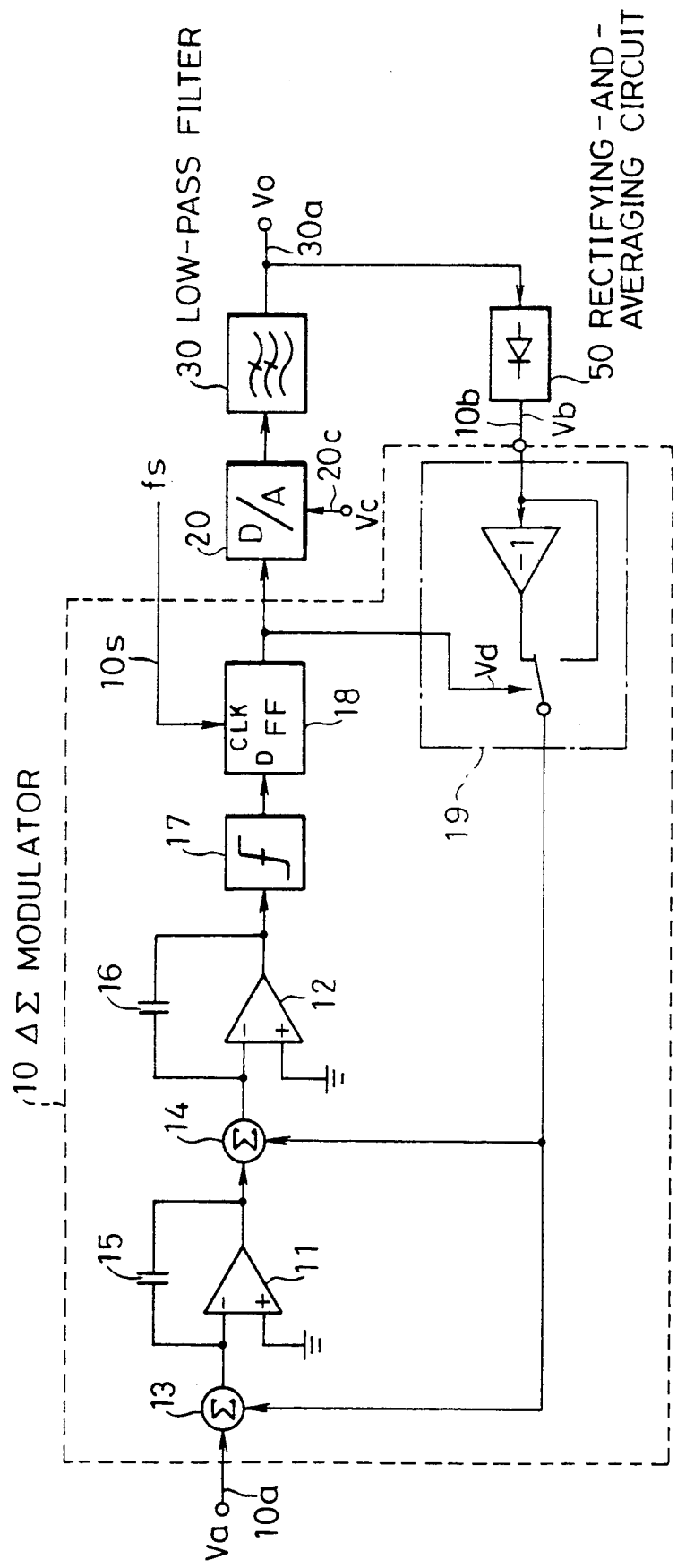
FIG. 8 is a block diagram of the analog arithmetic circuit in accordance with the present invention when it is used as a compression circuit.

4) Compression (FIG. 8)

An operated signal Va is delivered to the line 10a; the signal Vb obtained by processing the output signal from the line 30a by the rectifying-and-averaging circuit 50 (to be described in more detail hereinafter) is applied to the line 10b; and a predetermined constant reference voltage Ve is supplied to the line 20c. Then the compression signal Vo of the operated signal Va can be derived from the output line.

5) Multiplication and Division

An operated signal Va is applied to the line 10a; an operating signal Vb is supplied to the line 10b; and another operating signal Vc is delivered to the line 20c. Then the result (Va×Vc)/Vb is derived from the output line 30a.

6) AGC (Automatic Gain Control)

An operated signal Va is delivered to the line 10a; the signal obtained by processing the operated signal Va by the rectifying-and-averaging circuit (to be described in detail hereinafter) is supplied to the line 10b as the operating signal Vb; and a predetermined constant reference voltage Vc is applied to the line Vc. Then, the analog signal Vo having a constant amplitude regardless of the average level of the operated signal Va can be obtained from the output line 30a.

7) Combinations of the Arithmetic Operations

An operated signal Va is delivered to the line 10a; the signal Vb obtained as in 4) above is supplied to the line 10b; and an operating signal Vc is applied to the line 20c. Then, the compression signal Vo of the product (Va×Vc) can be derived from the output line 30a. Furthermore, when an operated signal Va is applied to the line 10a, the signal Vc obtained as in 3) above is supplied to the line 20c, and an operating signal Vb is applied to the line 10b, the output Vo which the expansion signal of the quotient Va/Vb is derived from the output line 30a.

As described above, the analog arithmetic circuit in accordance with the present invention can execute various arithmetic operations. If it is required to supply two or more operating signals to the first or second D/A converter 19 and 20 as a reference signal, it is sufficient to provide another adder so as to obtain the sum total of a plurality of the operating signals. In like manner, when it is necessary to deliver a plurality of operated signals, it is sufficient to provide an adder so as to obtain the sum total of the operated signals.

Each of the signals delivered to the lines 10a, 10b and 20c can be a voltage or current signal depending on the construction of the circuit.

Practical examples of various arithmetic operations carried out by the analog arithmetic circuit shown in FIG. 1 will be described.

MULTIPLIER

FIG. 5 is a block diagram illustrating the fundamental construction of the multiplier. A predetermined constant reference signal Vb to be applied to the first D/A converter 19 is generated within the circuit. For example, a sinusoidal operating signal Vc shown in FIG. 2G is supplied as the reference signal to the second D/A converter 20 through the line 20c. When the analog signal shown in FIG. 2E is delivered to the line 10a as an operated signal Va, a pulse train Ve shown in FIG. 2H with the pulse density corresponding to the product and Va×Vc is produced in response to the clock pulses fs transmitted through the line 10s, and is delivered to the low-pass filter 30 which suppresses the high frequency component. Thus, the product output Vo(=-Va×Vc) shown in FIG. 2I is derived from the output line 30a.

DIVIDER

Figure 6:
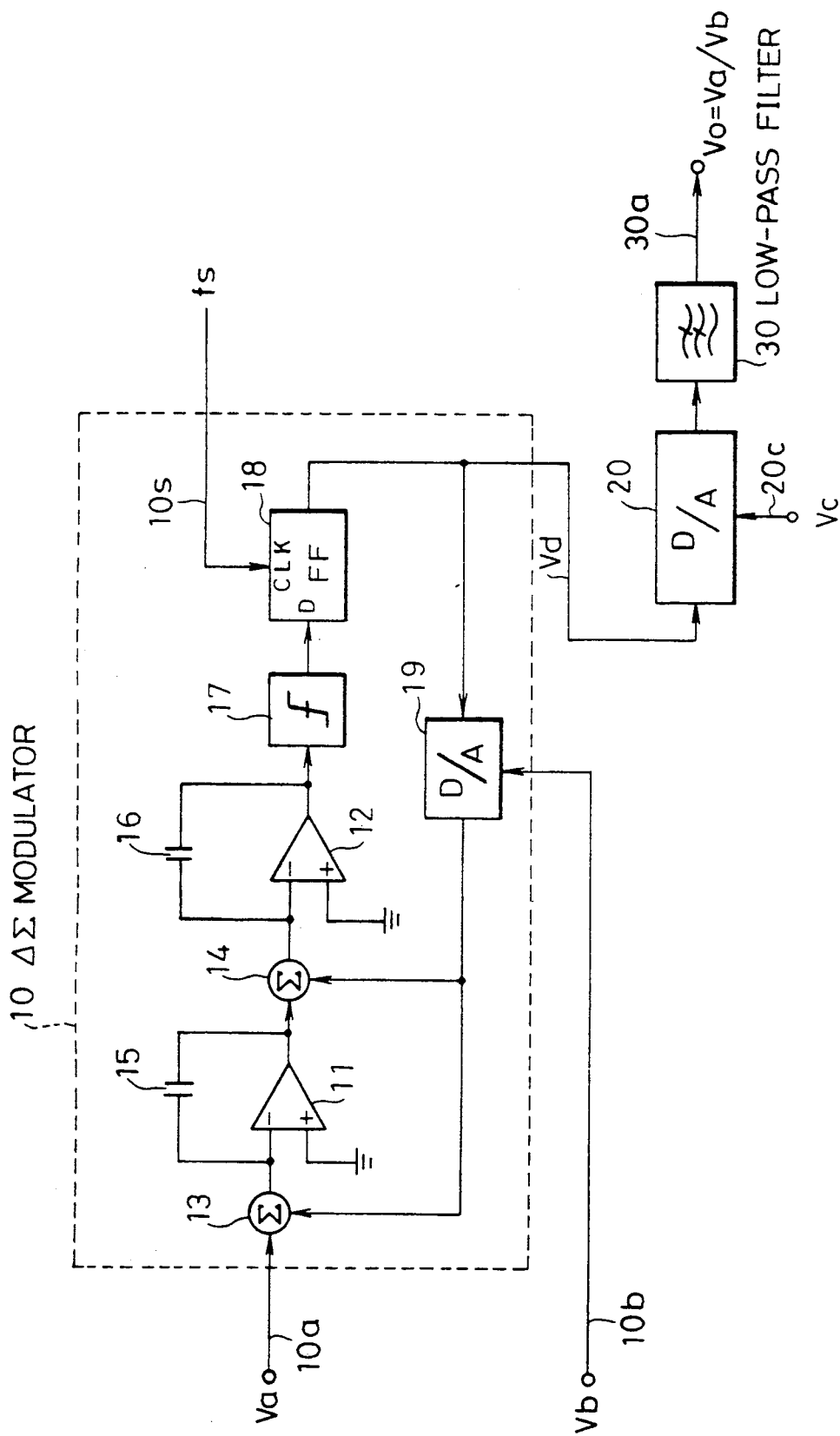
FIG. 6 is a block diagram of the analog arithmetic circuit in accordance with the present invention when it is used as a divider.

FIG. 6 is a block diagram illustrating a basic construction of a divider. A predetermined constant reference signal Vc generated in the circuit is applied to the second D/A converter 20, and the operating signal $V_1$ and $V_2$ in the form of an electric current shown in FIG. 2C are delivered to the line 10b as a reference signal for the first D/A converter 19.

When a sinusoidal waveform having an amplitude A as shown in FIG. 2A is delivered to the line 10a as an operated signal Va, the pulse train Vd with the pulse density proportional to Va/Vb(=A/$V_1$ or A/$V_2$) as shown in FIG. 2D is delivered to the second D/A converter 20 in synchronism with the clock pulse fs transmitted through the line 10s. The high frequency component is then cut off by the low-pass filter 30, and the quotient Vo(=Va/Vb) shown in FIG. 2J is obtained from the output line 30a.

EXPANSION CIRCUIT

FIG. 7 is a block diagram illustrating a fundamental construction of an expansion circuit. The operated signal Va transmitted through the line 10a is processed by the rectifying-and-averaging circuit 40 and is delivered through the line 20c to the second D/A converter 20 as the reference signal Vc. On the other hand, a predetermined constant signal Vb is generated in the first D/A converter 19, and is applied thereto. The second D/A converter 20, in response to the digital signal Vd from the flip-flop 18, converts the reference signal Vc into a pulse train with positive and negative pulses representing the polarity and the density of the reference signal Vc. After that, the output signal Vc of the second D/A converter 20 is filtered by the low-pass filter 30, and the expanded signal Va of the operated signal is produced from the output line 30a.

Figure 9:
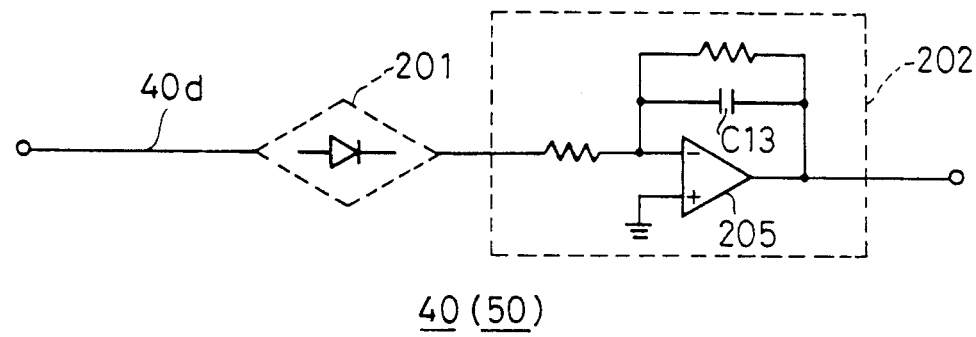
FIG. 9 is a schematic block diagram illustrating one example of an rectifying-and-averaging circuit used in the analog arithmetic circuit in accordance with the present invention.

FIG. 9 is a block diagram illustrating a basic construction of a rectifying-and-averaging circuit 40 which comprises a rectifier 201, and an averaging circuit 202 connected to the output terminal of the rectifier 201. As the rectifier 201, a full-wave or half-wave rectifier utilizing diodes can be used. The averaging circuit 202 is a kind of low-pass filter, and for instance, as shown in FIG. 9, is constructed by an operational amplifier 205 with a feedback loop consisting of a capacitor $C_{13}$ and a resistor connected in parallel each other.

Figure 10:
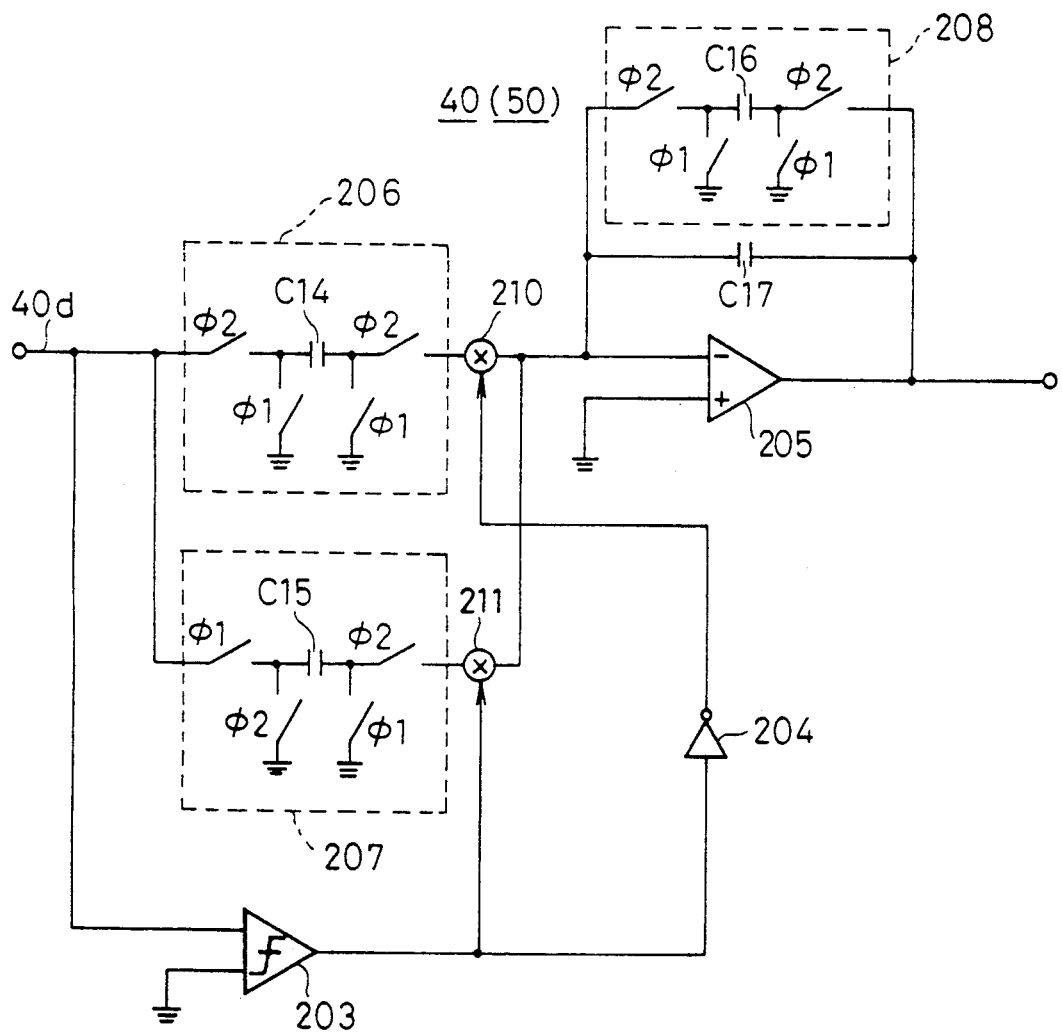
FIG. 10 is a block diagram illustrating a more practical construction of the rectifying-and-averaging circuit shown in FIG. 9.

FIG. 10 illustrates the rectifying-and-averaging circuit 40 which is constructed with switched-capacitors. The construction shown in FIG. 10 uses the outputs from a comparator 203 and an inverter 204 as gate signals instead of using the output Q and $\overline{Q}$ from $\Delta\Sigma$ modulator 10 which are used as gate signals of the switched-capacitors in FIG. 4B: the rectifying-and-averaging circuit 40 compares the input signal supplied to the input line 40d with the ground voltage by the comparator 203, and produces the gate signals.

When the input signal supplied to the input line 40d is positive, the input signal is delivered through a switched-capacitor 207 and a gate to 211 an operational amplifier 205 which transmits and outputs only the low frequency component using a switched-capacitor 208 and a capacitor $C_{17}$.

On the other hand, when the input signal is negative, the output from the comparator 203 is inverted through an inverter 204, and the output gate 211 of the switched-capacitor 206 is turned on. The input signal transmitted through the input line 40d is inverted by using switched-capacitors 206 and 208, the capacitor $C_{17}$, and the operational amplifier 205, and only the low frequency component is outputted.

As described above, the rectifying-and-averaging circuit 40 functions as a rectifying circuit: when the signal entering the input line 40d is positive, it is maintained positive, whereas when the signal is negative, it is reversed to positive. In such a way, the rectifying-and-averaging circuit 40 accomplishes the rectification, and in addition, delivers the low frequency component, thereby accomplishing the averaging operation. Incidentially, the cutoff frequency of the low-pass filter is preferably lower than that of the low-pass filter shown in FIG. 4B.

Figure 11:
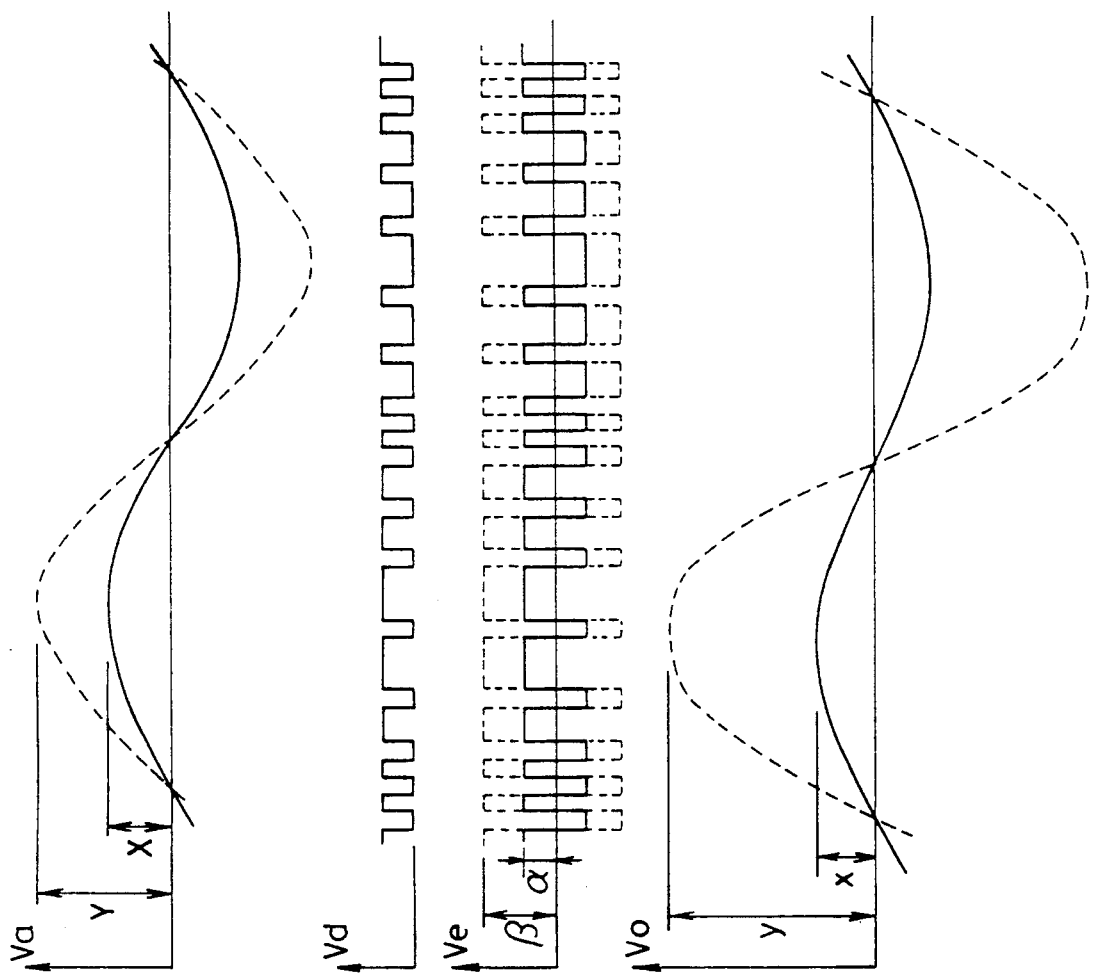
FIGS. 11A-11D are diagrams illustrating the signal waveforms at various points in FIG. 7.

Referring back to FIG. 7, when an analog signal with the maximum amplitude X shown in FIG. 11A is delivered to the line a as an operated signal, Va the output Vd from the $\Delta\Sigma$ modulator 10 takes a form of a pulse train with the pulse density proportional operated to the analog signal Va of FIG. 11A as shown in FIG. 11B.

The operated signal Va with the maximum amplitude X shown in FIG. 11A is also delivered to the rectifying-and-averaging circuit 40 so that the analog signal output Vc with the amplitude $\alpha$ (not shown) can be derived.

The output Ve of the second D/A converter 20 takes a pulse-shaped waveform shown in FIG. 11C, the pulse density of which is proportional to the amplitude of the operated signal Va with the maximum amplitude X, and the amplitude of which is equal to the amplitude $\alpha$ of the output Vc from the rectifying-and-averaging circuit 40.

The output Ve thus obtained is transmitted through the low-pass filter 30. As a result, the output signal shown in FIG. 11D, the wave shape of which is substantially similar to that of the operated signal, Va in FIG. 11A and the amplitude of which is X, is obtained from the low-pass filter 30.

Next, when the operated signal Va with the maximum amplitude Y (see FIG. 11A) is delivered to the input line Va, the amplitude of the output Vo from the rectifying-and-averaging circuit 40 takes a value $\beta$, and the above-mentioned values X, Y, $\alpha$ and $\beta$ have the following relation:

$$Y/X = \beta/\alpha$$

In addition, the pulse density of the output Vd of $\Delta\Sigma$ modulator 10 varies to (Y/X) times the previous density. Incidentally, the pulse train shown in FIG. 11B is drawn as if the pulse density thereof were not varied, but in practice, the pulse density varies.

Hence, the amplitude of the operated signal Va with the maximum amplitude Y, when it has passed through the low-pass filter 30, is increased by the ratio expressed by the following equations:

$$y/x = (\beta/\alpha) \cdot (Y/X) = (Y/X) \cdot (Y/X) = (Y/X)^2.$$

This is because, in the case of the analog signal Va with the amplitude Y, the input signal Vc fed from the rectifying-and-averaging circuit 40 to the second D/A converter 20 is increased by the factor $\beta/\alpha$, and at the same time the pulse density of the pulse train Vd fed from the flip-flop 18 to the second D/A converter 20 is increased by the factor Y/X, compared with the analog signal Va with the maximum amplitude X. As a result, the ratio between these two output signals from the low-pass filter 30 becomes a square of the ratio of the maximum amplitudes of the original input signals.

So far it has been described that X and Y have their respective constant amplitudes, so that $\alpha$ and $\beta$ are maintained constant. However, if each X and Y represents and arbitrary amplitude of the operated signal, Va $\alpha$ and $\beta$ have the amplitudes and pulse density in accordance with the amplitudes X and Y. Thus, the above-mentioned relation can be maintained, and hence, the dynamic range of the input signal is expanded, whereby the function of the expansion circuit is accomplished.

COMPRESSOR

FIG. 8 is a block diagram illustrating a basic construction of a compressor. The operated signal Va is transmitted through the input line 10a. The analog output signal Vo produced from the output line 10a is further processed by a rectifying-and-averaging circuit 50, and is delivered through the line 10b to the first D/A converter 19 as the reference signal Vb. The predetermined constant reference signal Vc is generated within the second D/A converter 20, and is supplied thereto. As the rectifying-and-averaging circuit 50, a circuit similar to that used in the expansion circuit described above can be used.

In FIG. 8, the analog signal Va with the maximum amplitude A shown in FIG. 2A is applied to the input line 10a, and the signal with the amplitude B (to be described in detail hereinafter) is delivered to the first A/D converter 19 as the reference signal Vb. Then the $\Delta\Sigma$ modulator 10 outputs a pulse train Vd with the pulse density proportional to A/B as shown in FIG. 2D. When the signal thus obtained is transmitted through the second A/D converter 20 and the low-pass filter 30, the signal with the maximum amplitude C shown in FIG. 2K is obtained.

In this case, when the signal Vo shown in FIG. 2K is transmitted through the rectifying-and-averaging circuit 50, the reference signal Vb with the amplitude B is obtained.

The above-mentioned amplitude C is proportional to A/B, and in addition B is proportional to C so that the following equation is obtained:

$$C = K_1 \cdot (A/B) = K_1 \cdot A \cdot (1/K_2 \cdot a)$$

and the above equation can be transformed into $$\frac{C}{A} = \sqrt{K_1 \cdot K_2} \cdot \sqrt{A}$$

Therefore, the analog output signal Vo derived from the output line 30a is proportional to the root of the operated signal Va entering the input line 10a. Thus, the dynamic range (represented by logarithm) of the operated signal Va can be compressed by one half.

When the operated signal Va entering the input line 10a approaches zero, the output signal Vo derived from the output line 30a also approaches zero. As a result, the reference signal Vb applied to the first D/A converter 19 also approaches zero so that the stable operation cannot be ensured.

Figure 12:
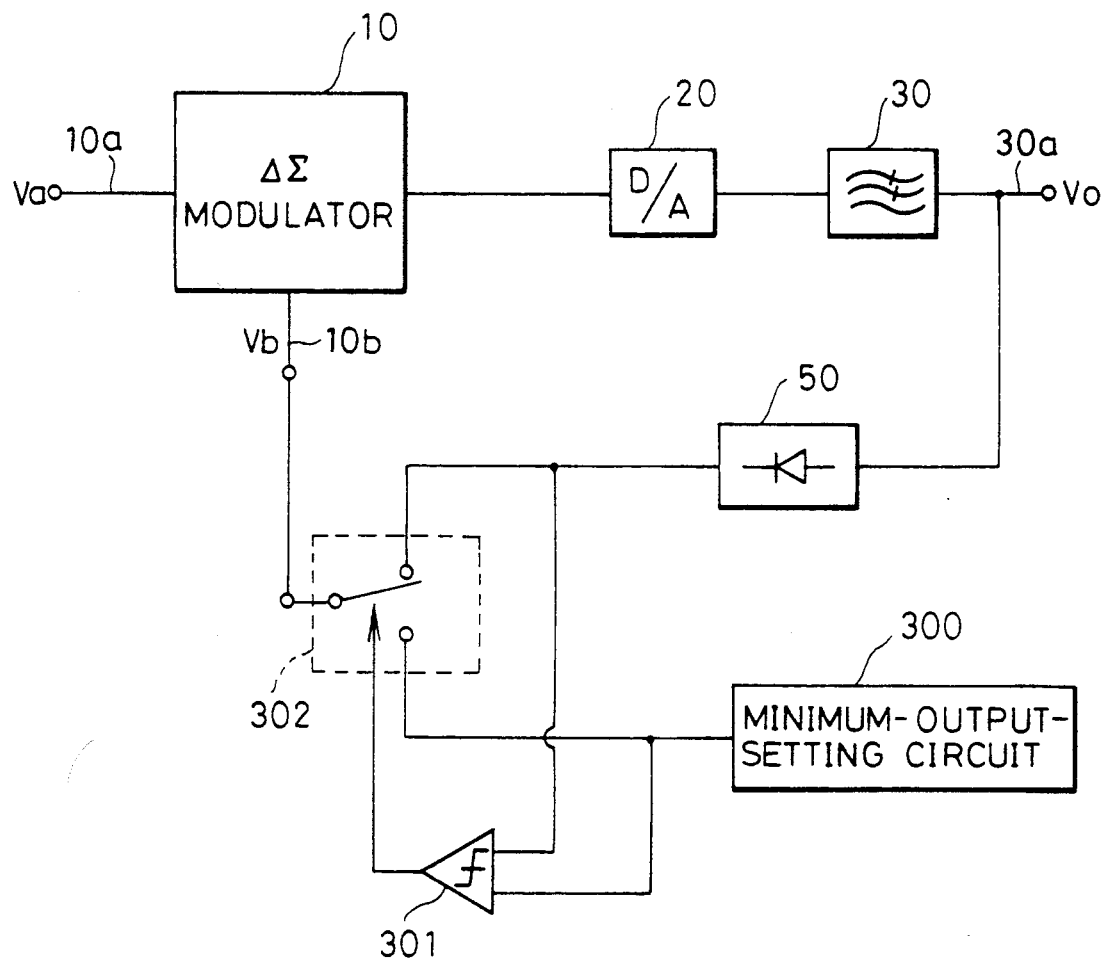
FIG. 12 is a block diagram illustrating one example of a compression circuit wherein a minimum-output-setting unit is added to the compression circuit shown in FIG. 8.

To prevent this, a minimum-output-setting circuit 300 shown in FIG. 12 is provided in addition to the rectifying-and-averaging circuit 50. When the output of the rectifying-and-averaging circuit 50 declines below the output of the minimum-output-setting circuit 300, the input Vb to the first D/A converter 19 is switched from the output of the rectifying-and-averaging circuit 50 to the output of the minimum-output-setting circuit 300 by means of a comparator 301 and a switch 302. Thus, the above-described unstable operation can be avoided.

The minimum-output-setting circuit 300 shown in FIG. 12 will be described in more detail hereinafter.

The ΔΣ modulator 10, the second D/A converter 20, the low-pass filter 30 and the rectifying-and-averaging circuit 50 are arranged in a manner substantially similar to those described hereinbefore. The output voltage of the minimum-output-setting circuit 300 is determined to a voltage at which the operation of the arithmetic operation circuit becomes unstable because of the decline of the output of the rectifying-and-averaging circuit 50. In this case, the voltage set by the circuit 300 is assumed to be, for instance, 10 mV. The comparator 301 compares the output of the rectifying-and-averaging circuit 50 with the output voltage derived from the minimum-output-setting circuit 300. When the output voltage from the rectifying-and-averaging circuit 50 declines below 10 mV, in response to the signal from the comparator, the input signal Vb applied to the input line 10b of the first D/A converter 19 (FIG. 8) is switched from the output of the rectifying-and-averaging circuit 50 to the output of the minimum-output-setting circuit 300. When the output signal of the minimum-output-setting circuit 300 is delivered to the input line 10b, the output of the analog arithmetic circuit is proportional to the operated signal, Va and its operation is stabilized.

The lower the output voltage produced from the minimum-output-setting circuit 300, the wider the compression region, and the narrower the proportional region. This will make the operation more unstable. In contrast, the higher output voltage of the minimum-output-setting circuit 300 makes the operation more stable, although the compression region is made narrower.

INDUSTRIAL APPLICABILITY

As described above, according to the present invention, ΔΣ modulator, the D/A converters and the low-pass filter are utilized. As a reference signal for the first and/or second D/A converters, an operating signal is applied to one or both of the converters so that various arithmetic operations such as multiplication, division, expansion, compression and the combinations thereof can be executed.

Furthermore, the present invention can provide an analog arithmetic circuit which is simple in construction and can be made compact in size in the form of an LSI. Moreover, a common circuit can provide various arithmetic circuits so that the data associated with the circuit can be collected as a library. This makes it possible to shorten the time for designing the analog arithmetic circuit, and in addition, to systematize the design in conjunction with other circuits.

We claim:

1. An analog arithmetic circuit which receives an operated signal and a variable operating signal, and outputs the result of an arithmetic operation, said analog arithmetic circuit comprising;

ΔΣ modulation means having A/D conversion means and first D/A conversion means, said A/D conversion means sampling said operated signal at a predetermined sampling frequency, thereby outputting a digital signal, and said first D/A conversion means receiving said digital signal, and outputting a first analog signal that takes a positive or negative amplitude determined by a binary state of said digital signal and an amplitude of a first reference signal applied to said first D/A conversion means, said first D/A conversion means including means for feeding said first analog signal back to said A/D conversion means as a feedback signal to an input of said D/A conversion means to produce a difference signal between the operated signal and the feedback signal;

second D/A conversion means for receiving said digital signal and outputting a second analog signal that takes a positive or negative amplitude determined by a binary state of said digital signal and an amplitude of a second reference signal applied to said second D/A conversion means; and low-pass filtering means for receiving said second analog signal and outputting an analog signal representing the result of an arithmetic operation, wherein the analog arithmetic circuit includes means for applying at least one of first reference signal and said second reference signal as said variable operating signal.

2. An analog arithmetic circuit as claimed in claim 1, wherein the digital signal outputted from said ΔΣ modulation means is a 1-bit digital signal.

3. An analog arithmetic circuit as claimed in claim 1, wherein each of said first and second D/A conversion means comprises a first switched-capacitor circuit, a first gate whose input is connected to an output of said first switched capacitor circuit, a second switched capacitor circuit, and a second gate whose input is connected to an output of said second switched capacitor circuit, said first or second reference signal being applied to each input of said first and second switched capacitor circuits, each output of said first and second gate being connected in common to form the output of said D/A conversion means, and each control terminal of said first and second gate being connected to said first or second D/A conversion means to receive the digital signal applied thereto.

4. An analog arithmetic circuit as claimed in claim 1, wherein said low-pass filter comprises an operational amplifier, a switched capacitor circuit which is connected between an inverting input and an output of said operational amplifier, and a capacitor connected in parallel with said switched-capacitor circuit.

5. An analog arithmetic circuit as claimed in claim 1, wherein said first reference signal has a constant amplitude, and the analog arithmetic circuit includes means for applying said second reference signal as said variable operating signal, and means for producing a signal representative of a product obtained by multiplying said operated signal and said variable operating signal.

6. An analog arithmetic circuit as claimed in claim 5, including means for obtaining said variable operating signal by rectifying and averaging said operated signal, and means for expanding said operated signal by squaring it.

7. An analog arithmetic circuit as claimed in claim 1, wherein said second reference signal has a constant amplitude, and the analog arithmetic circuit includes means for applying said second reference signal as said variable operating signal and means for producing a signal representative of a quotient obtained by dividing said operated signal by said variable operating signal.

8. An analog arithmetic circuit as claimed in claim 7, including means for obtaining said variable operating signal by rectifying and averaging said quotient signal, and means for compressing said operated signal by taking a root of it.

9. An analog arithmetic circuit as claimed in claim 7 or in claim 8, wherein the rectifying and averaging operation of said quotient signal is carried out by using switched capacitors, a comparator and an operational amplifier.

10. An analog arithmetic circuit as claimed in claim 8, wherein the rectifying and averaging operation is carried out by a rectifying-and-averaging circuit comprising:

a first switched-capacitor circuit whose input is connected to an input of said rectifying-and-averaging circuit;
a first gate connected to an output of said first switched-capacitor circuit;
a second switched-capacitor circuit whose input is connected to the input of said rectifying-and-averaging circuit;
a second gate connected to an output of said second switched-capacitor circuit;
a comparator having an input connected to the input of said rectifying-and-averaging circuit and whose output is connected to a control terminal of said second gate;
an inverter whose input is connected to the output of said comparator and whose output is connected to a control terminal of said first gate;
an operational amplifier whose inverting input is connected to outputs of said first and second gates;
a capacitor connected between the inverting input and an output of said operational amplifier; and
switched capacitor circuit connected between the output and input of said operational amplifier.

11. An analog arithmetic circuit as claimed in claim 8, further comprising:

a minimum-output-setting means for setting a predetermined minimum value;
a comparator for comparing the rectified-and-averaged output with the predetermined minimum value;
switching means for selecting, in response to an output of said comparator, the rectified-and-averaged output when it is greater than the predetermined minimum value, or the predetermined value when the rectifying-and-averaged value is less than the predetermined value.

* * * * *

UNITED STATES PATENT AND TRADEMARK OFFICE
CERTIFICATE OF CORRECTION

PATENT NO. : 5,150,324

DATED : September 22, 1992

INVENTOR(S) : Kaoru Takasuka et al

It is certified that error appears in the above-identified patent and that said Letters Patent is hereby corrected as shown below:

On the title page: Item [54] and Column 1, line 2 & 4
change "MULTIPLICATION DIVISION" to --MULTIPLICATION, DIVISION, --.

Title, change "DELTA SIGMA" to --DELTA-SIGMA--.
Item [73] Assignee, change "Asahi Kasei Microsytems Co. Ltd." to
--Asahi Kasei Microsystems Co., Ltd. --.
Claim 1, column 14, line 14, change "comprising;" to --comprising: --.
      column 14, line 42, before "first" insert --said--.
Claim 9, column 15, line 28, change "claim 7" to --claim 6 --.

claim 10, column 16, line 22, before "switched" insert --a--.

Insert "Attorney, Agent, or Firm" and insert "Finnegan, Henderson, Farabow, Garrett and Dunner".

Signed and Sealed this

Sixteenth Day of November, 1993

Attest:

BRUCE LEHMAN

*Attesting Officer*    *Commissioner of Patents and Trademarks*